US010318679B2

(12) United States Patent
Tago et al.

(10) Patent No.: US 10,318,679 B2
(45) Date of Patent: Jun. 11, 2019

(54) CALCULATION METHOD OF SWITCHING WAVEFORM OF THE INVERTER AND CIRCUIT SIMULATION MODEL

(71) Applicant: Hitachi, Ltd., Chiyoda-ku, Tokyo (JP)

(72) Inventors: Kazutami Tago, Tokyo (JP); Naoki Sakurai, Tokyo (JP); Kinya Kobayashi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 507 days.

(21) Appl. No.: 14/963,922

(22) Filed: Dec. 9, 2015

(65) Prior Publication Data

US 2016/0171139 A1 Jun. 16, 2016

(30) Foreign Application Priority Data

Dec. 10, 2014 (JP) ................................ 2014-249492

(51) Int. Cl.
G06F 19/00 (2018.01)
G01R 19/25 (2006.01)
H02M 1/00 (2006.01)
G06F 17/50 (2006.01)

(52) U.S. Cl.
CPC .................. *G06F 17/5036* (2013.01)

(58) Field of Classification Search
CPC ..................... G06F 17/5036; G01R 19/25
USPC ................................................ 702/66; 703/2
See application file for complete search history.

(56) References Cited

U.S. PATENT DOCUMENTS

| 2012/0051099 A1* | 3/2012 | Funaba | H02M 1/08 363/21.17 |
| 2014/0355321 A1* | 12/2014 | Akagi | H02M 7/483 363/131 |
| 2014/0368280 A1* | 12/2014 | Knopik | H03F 1/52 330/298 |
| 2016/0072424 A1* | 3/2016 | Yokozutsumi | H02M 7/53875 318/503 |

FOREIGN PATENT DOCUMENTS

JP 2009-26298 A 2/2009

OTHER PUBLICATIONS

Hashizume, S., "Actual Operation Verification of SPICE Parameter of Power MOSFET", Transistor Technology, Dec. 2000, CQ Publishing Co., Ltd., pp. 275-285 (eleven (11) pages).
Abe, Y. et al., "Coupled Analysis Simulation Technique Using Semiconductor Device and Circuit", Fuji Electric Journal (2003), vol. 74, No. 4, pp. 221-224 (four (4) pages).

\* cited by examiner

*Primary Examiner* — John E Breene
*Assistant Examiner* — Jeffrey P Aiello
(74) *Attorney, Agent, or Firm* — Crowell & Moring LLP

(57) ABSTRACT

In a calculation method of calculating a switching wave form of an inverter by expressing a wave form obtained by measurement or simulation using a function formula, an intermediate terminal is provided between an upper terminal and a lower terminal of an inverter arm and a power supply of a voltage function formula is provided between the upper terminal and the intermediate terminal or the intermediate terminal and the lower terminal. Further, it may be configured such that a variation impact from peripheral circuits at time of switching is calculated and voltage correction calculation is performed to prevent the calculated switching (Continued)

wave form from changing due to the calculation of the variation impact.

4 Claims, 6 Drawing Sheets

CALCULATION METHOD OF SWITCHING WAVEFORM OF THE INVERTER AND CIRCUIT SIMULATION MODEL

BACKGROUND OF THE INVENTION

1. Field of the Invention

The present invention relates to an analytical calculation method of performing analytical calculation using a circuit simulator, and a technique of a circuit simulation model.

2. Description of the Related Art

Clean systems and apparatuses have been developed using a motor as a main power source in order to cope with environmental issues. An inverter is one of converters in a system to be used to drive an alternating-current motor. The inverter is capable of outputting a rectangular wave voltage through a switching operation of a semiconductor element, and simulating a sinusoidal wave having desired frequency and amplitude by superimposing rectangular waves. Accordingly, it is easy to adjust a rotational speed and an output torque of an electric motor, and the efficiency of motor can be significantly improved. Thus, the inverter is a power electronic device which is indispensable to the above-described systems and apparatuses.

A rectangular wave includes a harmonic component, and may be a factor that causes the harmonic component to generate electromagnetic noise. In addition, the rectangular wave is conducted in a circuit of an apparatus as a surge, and influences on voltage endurance properties or insulation properties of components. Meanwhile, an increase in frequency of a switching element has been promoted in order to improve conversion efficiency. Such an increase in frequency leads an increase in generating noise band, which easily influences on other devices. Further, a rising speed of the surge increases, which causes the great influence on the voltage endurance properties or the insulation properties of the components. That is, when the inverter, a cable, and the motor are connected, it is necessary to perform evaluation and design to include the semiconductor element and wiring inductance in the inverter, the cable and the motor such as influence on insulation degradation of the connected motor or radiation noise to be generated from the cable.

Meanwhile, it becomes hard to ignore influence of interaction between a parasitic inductance L of a wiring and a semiconductor element, and accordingly, it becomes hard to suppress an increase in the number of parts and the number of design processes only by relying on experience and know-how as in the related art. Thus, there is an increasing request on a design support through coupled analysis using device simulation and circuit simulation considering the parasite L of the wiring in addition to the device. In addition, there is an increasing request on a model of the device at the time of switching which can be calculated with the coupled analysis using the circuit simulation since the switching of the device becomes sources of generating the noise, the surge and a loss as described above.

A circuit simulator Spice described in "Actual Operation Verification of SPICE Parameter of Power MOSFET", Shin-ichi Hashizume, published in Transistor Technology (2000) of the December issue, P275 is generally used in an integrated circuit (IC) and a large-scale integration (LSI) as a simulator to calculate a device and a peripheral circuit. A diode, bipolar transistor, metal-oxide semiconductor field-effect-transistor (MOSEET) used in the IC or the LSI is provided as an equivalent circuit or a model format with standardized behavior. On the contrary, a power device has a larger change with respect to a change in temperature and voltage of an internal state of the semiconductor than that of the device used in the IC or the LSI, and further, the internal state of the semiconductor is nonlinearly changed by receiving influence of an external circuit such as a wiring inductance L, and accordingly, a wave form change thereof is significantly different from an ideal characteristics in a short period of time of the switching. Thus, a standard model for circuit analysis does not exist.

In addition, coupled analysis using device simulation with meshes and circuit simulation is possible in a small circuit, and it is possible to calculate a switching wave form with high accuracy in a device simulator of technology computer-aided design (TCAD) manufactured by Synopsys, Inc. (formerly, ISE Ltd.) described in "Coupled Analysis Simulation. Technique Using Semiconductor Device And Circuit", Yasushi Abe and Kouji Maruyama, published in Fuji Electric Journal (2003), Vol. 74, No. 4, p 221. However, it takes time for the calculation in the circuit analysis, and thus, an applicable size of the coupled analysis using the circuit simulation is small, and is limited to analysis of the short period of time. Thus, utilization in a circuit of actual electronic machine and equipment including a cable and a motor is difficult. In addition, detailed information including an internal structure of a device is required for the analysis.

In this manner, it is difficult to evaluate influence of the switching wave form of the power device on a product circuit in advance, and thus, the simulation has been used in a review of prototype evaluation.

Meanwhile, there is a technique described in JP-2009-26298-A as a technique of coupled calculation of a wave form of a device at time of switching using circuit simulation. The technique uses either a function formula or broken line approximation, and the function formula is used in the following description. According to the technique, the switching wave form is calculated using the circuit simulation in combination of a function formula of a static characteristic, and a power function formula, a current source function formula, or a non-linear passive element. Although it is difficult to confirm a circuit configuration on a circuit diagram screen like a commercially available circuit simulator as not being a program in circulation, terminals of an inverter arm forms a collector/emitter and a gate terminal. In addition, because this technique is a dedicated program, there is a problem in that it is difficult to utilize a function of a commercially available simulator with high versatility.

SUMMARY OF THE INVENTION

Switching of a device is a phenomenon in a short period of time of is order, and a wiring and an element that configure a main circuit of a power supply and a power device mainly influence a wave form at the time of switching. Accordingly, the wave form is mainly influenced by energizing current, voltage of the power supply, wiring inductance, IGBT gate resistance, device temperature on the closed circuit thereof. Thus, when the energizing current, the power supply voltage, the wiring inductance, the IGBT gate resistance and the device temperature are selected as parameters to designate a main circuit condition, a wave form generated in an inverter arm is substantially the same both in a small circuit such as a half bridge, and a large circuit to which the inverter, a cable and a motor are connected as long as those parameters are shared.

Thus, a technique which allows circuit simulation using a measured or simulated wave form is considered as an effective method. If there is a unit to realize the technique, internal structure information of a device is not required, and it is expected that the circuit simulation can be performed with the same accuracy of analysis as highly accurate simulation depending on accuracy of the used waveform. In addition, if the measured or simulated wave form can be used as a function formula, function calculation is performed, and thus, it is expected that the circuit simulation can be performed with calculation time equal to or less than that taken in the Spice in addition to the above-described expectation.

It is possible to cause a device wave form to be highly accurately fit in a function formula in a connection form of the wave form with a low-degree polynomial. In addition, circuit calculation regarding an arbitrary circuit condition, which influences on the waveform, is possible in a range covered by fit data when a coefficient of the fit function formula is interpolated and used. Thus, it is expected that the circuit simulation with a wide degree of freedom can be implemented.

Conventionally, however, it is difficult to use a result of measurement or detailed simulation for impact assessment on a product circuit with calculation speed, the same level as that of a circuit simulator according to a commercially available equivalent circuit model, and high calculation accuracy.

In this manner, there is a request for realization of a unit for calculating circuit characteristics, which operates in calculation time equal to or less than that of the circuit simulator according to the commercially available equivalent circuit model, has the same accuracy of analysis as the highly accurate device simulation, and is capable of circuit simulation of a device even with uncertain internal structure information. Further, there is a request for realization of a unit capable of circuit simulation by using the result of measurement or detailed simulation of current voltage wave form of switching as the function formula. In addition, there is a request also for being installable in a commercially available circuit simulator.

The present invention has been made in view of the above-described background, and an object of the present invention is to use a result obtained by measurement or highly accurate simulation of a switching wave form using a small circuit, for circuit simulation. In addition, another object of the present invention is to provide a device model capable of calculating influence of the switching wave form on a product circuit with high accuracy.

In order to solve the problems described above, a configuration described in the claims, for example, is adopted.

The present application includes a plurality of solutions to the above problems, and examples thereof include a calculation method of a switching wave form of an inverter, the method including: expressing a wave form obtained by measurement or simulation using a function formula; and calculating the switching wave form of the inverter, wherein an intermediate terminal is provided between an upper terminal and a lower terminal of an inverter arm, and a power supply of a voltage function formula is provided between the upper terminal and the intermediate terminal or the intermediate terminal and the lower terminal.

According to the present invention, it is possible to provide a calculation method of a switching wave form of an inverter, which is capable of highly accurately and efficiently performing circuit simulation of the switching wave form of a power device, and a circuit simulation model.

Other problems, configurations and effects than the above description will be apparent from the following description of embodiments.

DESCRIPTION OF THE PREFERRED EMBODIMENTS

Figure 1:
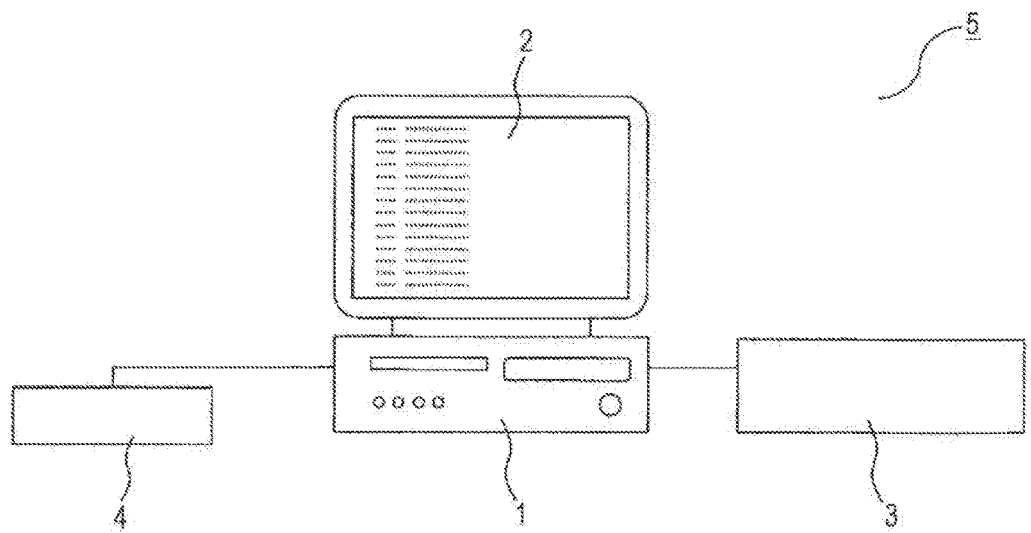
FIG. 1 is a diagram illustrating a configuration example of an analytical calculation system according to the present invention.

Next, modes for implementing the present invention (referred to as "embodiments") will be described in detail with reference suitably to the drawings. Incidentally, the same reference numerals are attached to the same components, and descriptions thereof will be omitted in the respective drawings.

The inventors have analyzed and reviewed a mechanism in which switching wave form is generated in a circuit of an inverter, and further newly reviewed a method of using a result, obtained by measurement or highly accurate simulation of a switching wave form using a small circuit, for circuit simulation to develop the usage thereof. In addition, the inventors have developed a unit (model) that can be installed in a commercially available circuit simulator. A description will be given in detail hereinafter.

Hereinafter, a description will be given by exemplifying a three-phase two-level inverter. Three phases of U, V and W are configured using a bridge formed of an upper arm and a lower arm as one phase. In a static case, a state of the upper or lower arm of the one phase can be confirmed using a gate signal and a current voltage of the arm. As shown in Table 1, a state in which an IGBT is in the state of being able to energized when the gate signal of the IGBT of the arm is high, and the IGBT is in the (ON) state of being energized when the IGBT is in an operating state. In addition, when a diode is in an energized state, reflux electric current flows in the diode regardless of high and low of the gate signal. In addition, when the gate signal is low and the diode is not in the energized state, the IGBT is in an OFF state in which high voltage is applied to upper and lower terminals of the arm. There is no other state. As stated in the note of Table 1, a gate signal of a reverse arm side has the high and low being either a reverse value or a low value. In addition, when the switching is generated as the gate signal of the reverse arm side changes from such a state, forward recovery (the gate signal: high→low) or reverse recovery (the gate signal: low→high) is generated in the diode. That is, at is possible to know a switching wave form that needs to be used for wave form calculation.

TABLE 1

CORRESPONDING RELATION BETWEEN ARM STATE
AND GATE SIGNAL IN STATIC CASE

|  |  | GATE SIGNAL* | |
| --- | --- | --- | --- |
|  |  | HIGH | LOW |
| ARM STATE | IGBT_off | NONE | OFF |
|  | IGBT_on | ON | NONE |
|  | Diode_BACK | NONE | OFF** |
|  | Diode_FORWARD | REFLUX | REFLUX** |

**AT THIS TIME, GATE SIGNAL OF REVERSE ARM HAS HIGH AND LOW BEING EITHER REVERSE VALUE OR LOW VALUE
**FORWARD RECOVERY IN CASE IN WHICH GATE SIGNAL OF REVERSE ARM IS CHANGED FROM HIGH TO LOW
***REVERSE RECOVERY IN CASE IN WHICH GATE SIGNAL OF REVERSE ARM IS CHANGED FROM LOW TO HIGH

In addition, in a case in which the switching is generated as the gate signal of the same arm changes from the arm state described above, it is possible to know a switching wave form that needs to be used from a combination of the arm state and the change of the gate signal. As shown in Table 2, it is possible to know whether the IGBT OFF wave form or diode reflux continuation from the arm state when the gate signal is changed from high low. In addition, it is possible to know whether the IGBT ON wave form or the diode reflux continuation when the gate signal is changed from low to high.

TABLE 2

CORRESPONDING RELATION BETWEEN CHANGE
IN GATE SIGNAL FROM AFOREMENTIONED
ARM STATE AND SWITCHING WAVEFORM

|  |  | GATE SIGNAL | |
| --- | --- | --- | --- |
|  |  | HIGH → LOW | LOW → HIGH |
| ARM STATE | IGBT_off | NONE | igbt ON WAVEFORM |
|  | IGBT_on | igbt OFF WAVEFORM | NONE |
|  | Diode_BACK | NONE | igbt ON WAVEFORM |
|  | Diode_FORWARD | diode REFLUX CONTINUATION | diode REFLUX CONTINUATION |

It is possible to use an IGBT ON resistance and a diode forward resistance as a static load of the energized state, and use an IGBT OFF resistance, a diode back resistance, or a sufficiently large resistance value as a static load of the OFF state for calculation of characteristics in the static case, and thus, the calculation can be easily performed.

In addition, a load formula, which can be continuously shifted from a small resistance to a large resistance, or from the large resistance to the small resistance, is used in series with voltage, and in parallel with current at the time of being shifted to switching wave form calculation expressed by a wave form function using a voltage source or a current source from the static load characteristics, and at the time of wave form calculation (for example, a form of an ideal current voltage characteristic formula of the diode can be continuously shifted between both the large resistance and the small resistance) Such a formula can adjust a difference between an actual circuit and rigidity caused by fixing a wave form using the voltage source or the current source, and is suitable for allowing the operation of the circuit simulator without failure. Such a difference includes, for example, (1) influence on a wave form caused when peripheral circuits are different from a circuit from which the wave form is acquired, and particularly, a superimposed perturbation (of wave form) at a time constant different from a time constant of the wave form, and (2) a difference at the time of modeling acquired wave form.

Meanwhile, voltage of one element model may be determined without any contradiction with respect to the peripheral circuits. Accordingly, in a case in which such an adjustment formula is introduced in the same element model, a fast change included in the wave form is sometimes blunted, and a current voltage wave form, desired to be obtained in the original calculation, is hardly obtained in the upper and lower terminals of the arm in some cases. Thus, the present invention uses a method of providing an intermediate terminal in the inverter arm, and providing the power supply of a voltage function formula between the upper terminal and the intermediate terminal (or between the intermediate terminal and the lower terminal). Accordingly, it is possible to allow the current voltage wave form, originally desired to be obtained, to be generated in the upper and lower terminals of the arm. This voltage function formula is set to be matched with a power supply voltage (a constant value) when a voltage wave form function of the upper arm and a voltage wave form function of the lower arm are added in the voltage function formula, and is capable of calculating the current voltage wave form, desired to be obtained in the original calculation, without the blunting of the fast change. Accordingly, the highly accurate calculation of the switching wave form becomes possible. Details thereof will be described later.

In addition, when a state in which a wave form variation ceases is formed, or the same state is formed after elapse of a certain period of time after the switching has occurred, it is possible to perform a shift to the characteristic calculation of the static case since the state is substantially the static state. As above, the description has been given regarding possibility of the circuit calculation including the highly accurate calculation of the switching wave form of the power device.

Next, a description will be given regarding a method of configuring an arm model capable of the switching wave form calculation as described above. This configuration will be described and created using VHDL-AMS, which is a global standard language of hardware description corresponding to an analog/digital mixed signal originated from the very-high-speed integrated circuit program. The VHDL-AMS is installed in Simplorer (registered trademark) manufactured by ANSYS, Inc., Saber (registered trademark) manufactured by SYNOPSYS, Inc., and SystemVision (registered trademark) manufactured by Mentor Graphics Corp., and is capable of describing and creating a model for the circuit calculation. When the created model is installed in those circuit simulators, it is possible to perform the circuit calculation using a function that the corresponding circuit simulator has. It is possible to make a description using the VHDL-AMS as follows by setting the element model, which uses the voltage source or the current source and the load formula of the switching wave form function to be in series with the voltage and to be in parallel with the current in the above description, as A, and setting the power supply element model of the voltage function formula, which is a different model by providing the intermediate terminal, as B. When a voltage across variable of the element model A is set as V1, and a current through variable of the element model A is set as I1 in the description of the element model A, a calculation formula can be described such that V1=voltage wave form function+load function voltage and I1 current wave form function+load function current. In addition, when a voltage across variable of the element model B is set as V2 in the description of the element model B, a calculation formula can be described such that V2=voltage function and I2 is no need for designation. In addition, it is also conceivable to include the voltage wave form function of the element model A in the voltage function of the element model B, but it is more natural to set the element model B as a correction voltage.

When the model is described as above, it is possible to display the voltage wave form according to the function of the circuit simulator between the intermediate terminal and the upper terminal, and it is possible to confirm that the voltage wave form generated by the power supply of the voltage function formula is configured by the set voltage wave form function. In addition, it is possible to confirm the voltage wave form similarly also in a case in which the power supply of the voltage function formula is provided between the intermediate terminal and the lower terminal.

When the model is described as above, it is possible to perform the circuit calculation in combination of a pulse width modulation (PWM) control, a cable model or a motor model. In addition, it is possible to expect calculation time to be equal to or less than that of an equivalent circuit model because the calculation time is the calculation of function formula. In addition, high calculation accuracy can be expected.

Next, a description will be given regarding a unit of applying the above-described content, obtained by reviewing the method of using the result of the measurement or the highly accurate simulation of the switching wave for using the small circuit, in actual circuit calculation.

System Configuration Example

FIG. 1 is a diagram illustrating a configuration example of an analytical calculation system according to this embodiment.

An analytical calculation system 5 has an analytical calculation device 1, a display device 2, an input device and a storage device 4. The analytical calculation device 1 is provided with not only a central processing unit such as a CPU, but also an internal storage device such as memory cache. The display device 2 is a display screen such as an image processing device and a liquid, crystal screen. The input device 3 is a direct input device or a medium input device such as a keyboard or a mouse. The storage device 4 is a storage medium that collectively refers to disk media including a semiconductor storage medium, a hard disk and the like.

The circuit simulator is stored in the storage device 4, and is configured so as to receive a user's instruction from the input device 3, performs processing using the analytical calculation device 1, and displays a result thereof on the display device 2 at the time of operation.

Specific Example

Hereinafter, a description will be given regarding a specific example of a model configuration operating in the analytical calculation system 5.

First Embodiment

Figure 2:
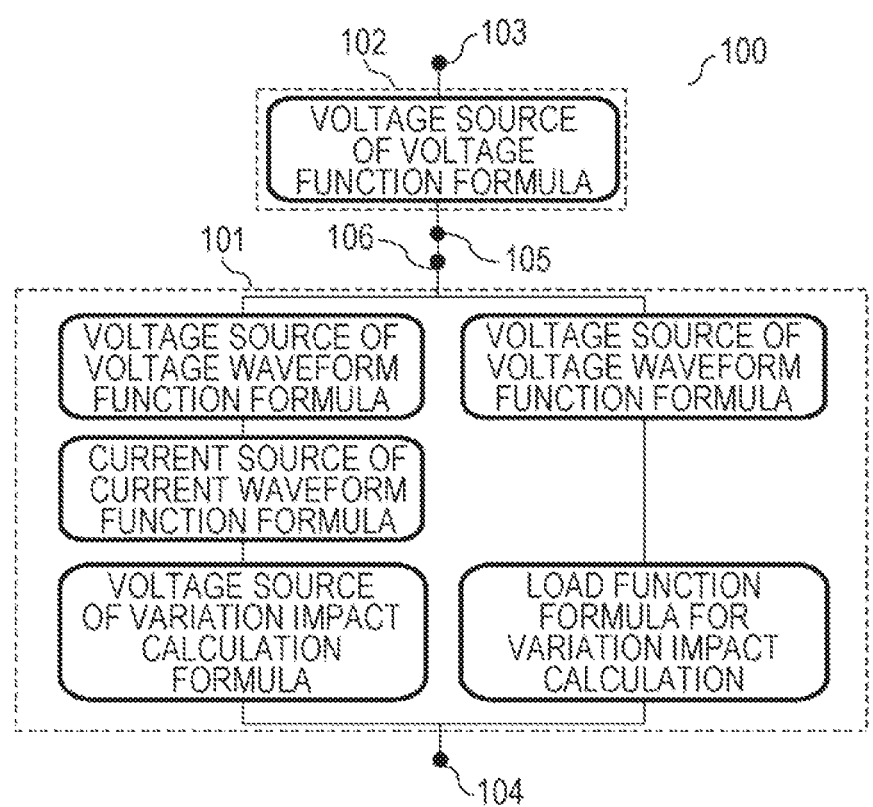
FIG. 2 is a diagram illustrating a configuration example of an inverter arm model according to the present invention (first embodiment)

FIG. 2 is a diagram illustrating a configuration example of an arm model of an inverter according to the present invention.

An arm model 100 includes an element model 101, an element, model 102, an upper terminal 103, a lower terminal 104, and intermediate terminals 105 and 106. The element model 102 is a voltage source according to a voltage function formula which has the upper terminal 103 and the intermediate terminal 105. The element model 101 is an element model which uses the voltage source or a current source of a switching wave form function and a load formula in series with voltage and in parallel with current while having the lower terminal 104 and the intermediate terminal 106. The first embodiment is a configuration at the time of calculating a switching wave form.

The arm model of the inverter according to the first embodiment is stored in the storage device 4 as the single element model of the circuit simulator, and is configured so as to receive a user's instruction and is displayed as a part of a circuit configuration on the display device 2. Further, it is configured such that the circuit calculation is performed when a circuit wire connection and model data are set by the input device 3 and the circuit configuration is completed, and a result of the calculation is displayed on the display device 2.

The processing unit 100 and the respective units 101 to 106 are embodied when an analytical calculation program stored in a read only memory (ROM) or the hard disk is developed in a random access memory (RAM), and is executed by the CPU incidentally, the arm model is stored in a so-called computer-readable recording medium including a magnetic recording medium such as the hard disk, an optical recording medium such as a compact disk-read only memory (CD) or a digital versatile disk (DVD), or the like.

Second Embodiment

Figure 3:
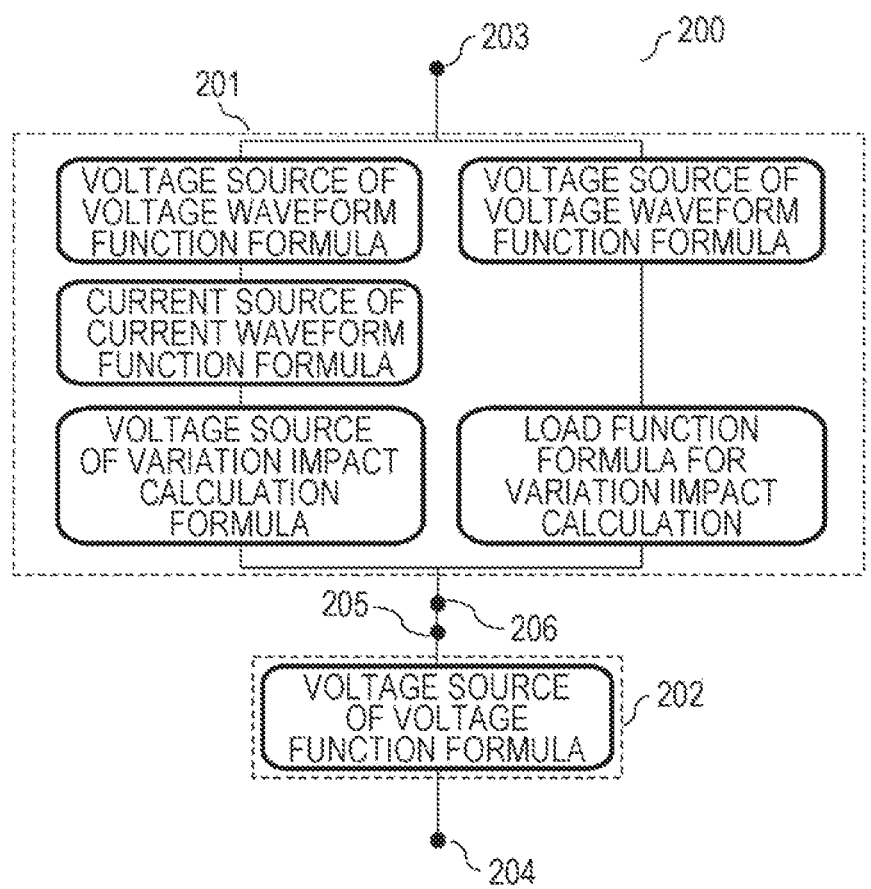
FIG. 3 is a diagram illustrating a configuration example of an inverter arm model of the present invention (Second embodiment)

FIG. 3 is a diagram illustrating a configuration example of an arm model of a second inverter according to the present invention.

An arm model 200 includes an element model 201, an element model 202, an upper terminal 203, a lower terminal 204, and intermediate terminals 205 and 206. The element model 202 is a voltage source according to a voltage function formula which has the lower terminal 204 and the intermediate terminal 205. The element model 201 is an element model which uses the voltage source or a current source of a switching wave form function and a load formula. In series with voltage and in parallel with current while having the upper terminal 203 and the intermediate terminal 206.

Since a system configuration and a relation thereof are the same as those of FIG. 2, descriptions thereof will be omitted.

Third Embodiment

Figure 4:
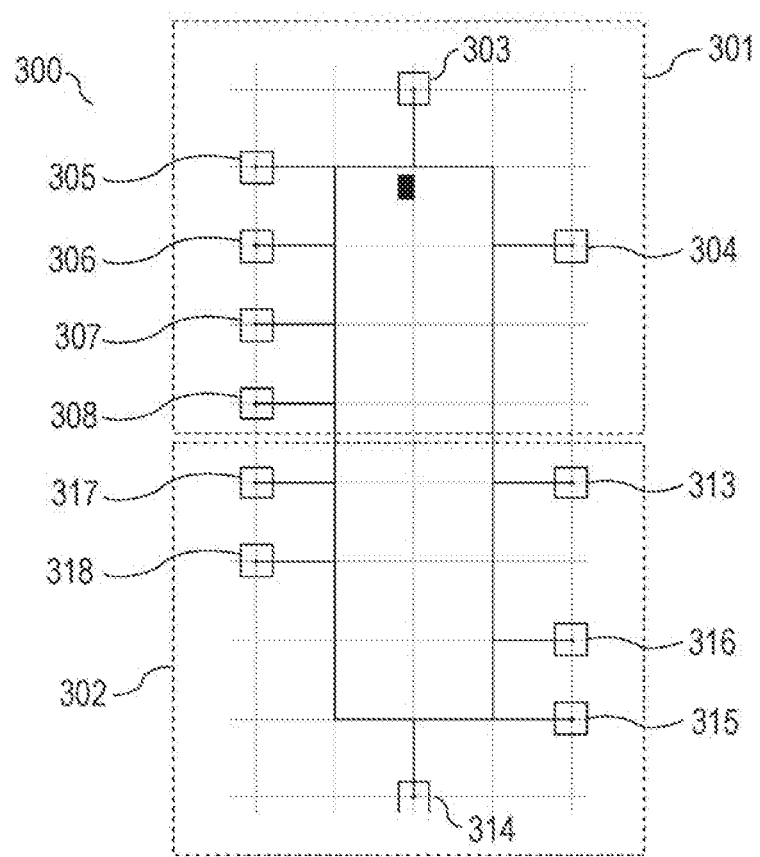
FIG. 4 is a diagram illustrating a configuration example of an inverter arm model of the present invention (third embodiment)

FIG. 4 is a diagram illustrating a configuration example of an arm model of a third inverter according to the present invention.

An integrated arm model 300 includes an upper arm model 301 and a lower arm model 302. The upper arm model 301 has an upper terminal 303, a lower terminal 304, intermediate terminals 305 and 306, and gate terminals 307 and 308. The lower arm model 302 has an upper terminal 313, a lower terminal 314, intermediate terminals 315 and 316, and gate terminals 317 and 318. For example, the upper arm model 301 is the same as the arm model 100 at the time of switching wave form calculation, and the lower arm model 302 is the same as the arm model 200 at the time of switching wave form calculation. When the intermediate terminals 305 and 306 are connected by through a circuit wire, it is possible to provide a portion between the upper terminal 303 and the intermediate terminal 305 and a portion between the intermediate terminal 306 and the lower terminal 304 as different element models, for example. The same configuration is possible regarding a lower arm model. The calculation of both the static characteristic and the switching wave form is implemented using information from the gate terminal in the third embodiment.

The modeling of the upper and lower arms in the integrated manner is advantageous because exchange of a data signal between models is not required at the time of using the voltage function of the reverse arm side in the voltage source of the voltage function or the time of using the state of the reverse arm side in the wave form calculation.

A system configuration and a relation thereof are the same as those of FIG. 2, descriptions thereof will be omitted.

An arm of the equivalent circuit model includes an upper terminal being an IGBT collector and a diode anode and a lower terminal being an IGBT emitter and a diode cathode, and does not include an intermediate terminal. In addition, JP-2009-26298-A does not describe a configuration in which the intermediate terminal is provided and the power supply of the voltage function formula is provided between the upper terminal and the intermediate terminal (or between the intermediate terminal and the lower terminal) as described above.

The inverter arm model of the third embodiment is capable of configuring a three-phase inverter bridge by being used as a model of each phase of U, V and U and wire-connected with the circuit. In addition, it is possible to perform the circuit calculation in combination with a PWM control model, a cable model, or a motor model.

Figure 5:
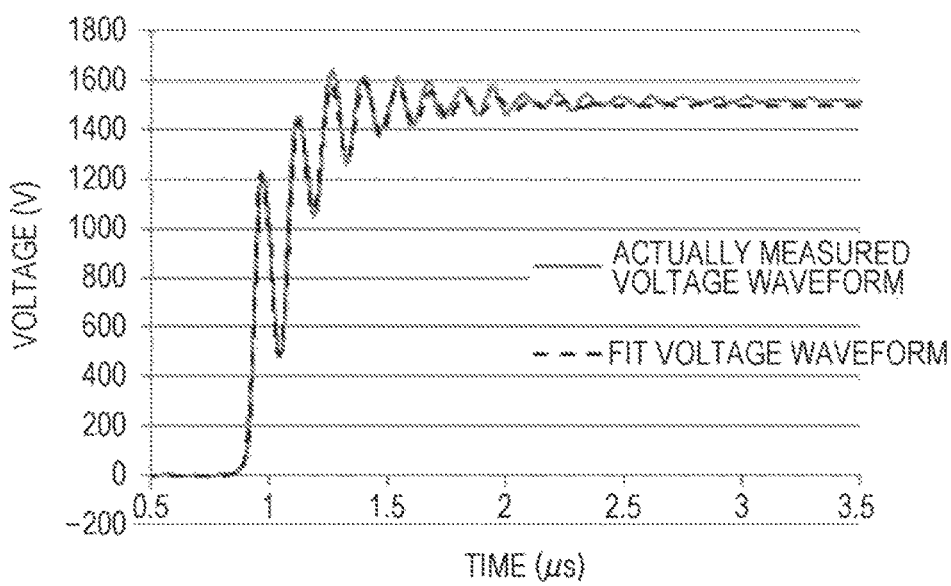
FIG. 5 is a diagram for describing examples of a measured voltage wave form and a fitting wave form thereof.
Figure 6:
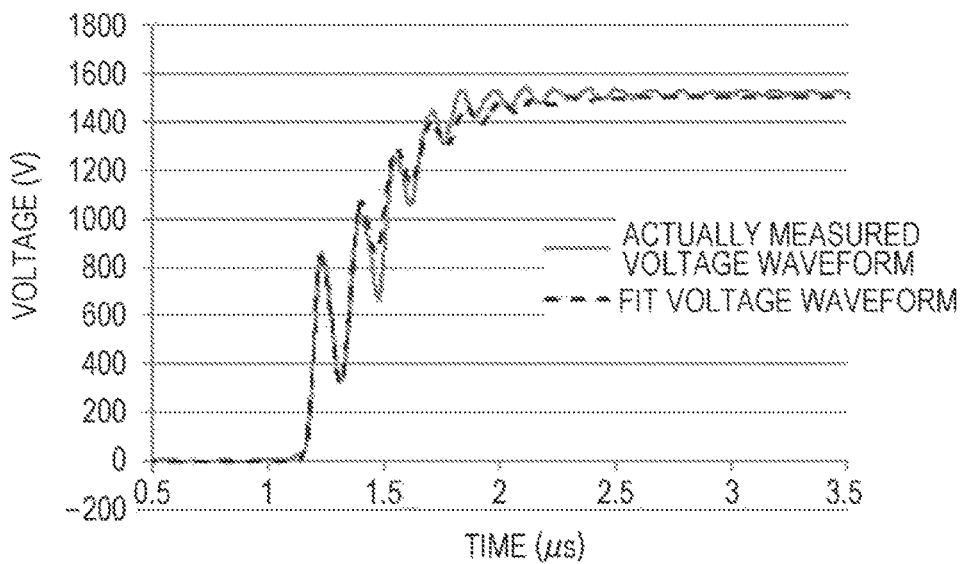
FIG. 6 is a diagram for describing examples of the measured voltage wave form and the fitting wave form thereof.
Figure 7:
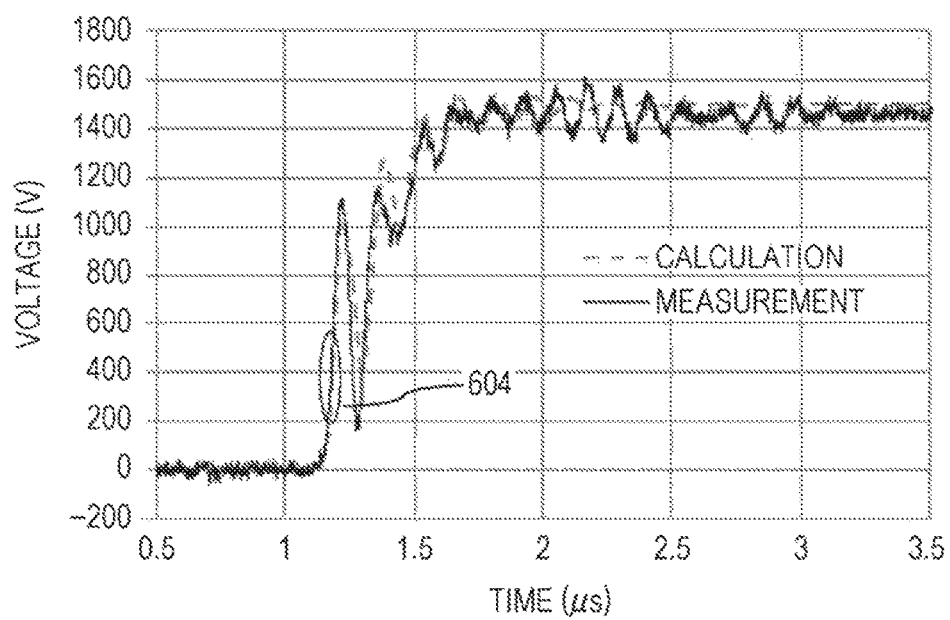
FIG. 7 is a diagram for describing an example of a result of switching wave form calculation implemented using an inverter arm model of the third embodiment.

FIGS. 5 to 7 are diagrams for describing examples of the result of the switching wave form calculation implemented using the third embodiment.

FIG. 5 is the diagram illustrating a recovery voltage wave form measured using a certain gate resistance and a fitting wave form thereof. FIG. 7 is the diagram illustrating a recovery voltage wave form measured using a gate resistance increased by 20% from the initial value, and a fitting wave form thereof. FIG. 7 is the diagram illustrating an inverter output wave form measured using an intermediate gate resistance, which is increased by 10% from the initial value, and the result of the switching wave form calculation which has been implemented using the third embodiment. The switching wave form is calculated by interpolating the coefficient of the fit function formula. When time differentials of voltage in a rising portion 604 of the voltage wave form are compared, the differentials are consistent with a difference of 4.2%, which indicates that the calculation according to the third embodiment is accurate.

As described above, it is possible to highly accurately and efficiently perform the circuit simulation of the switching wave form of the power device according to the present invention.

What is claimed is:

1. A calculation method of a switching waveform of an inverter, the method comprising:
   receiving an instruction from a user via an input device;
   expressing a waveform obtained by measurement or simulation using a function formula, based on the instruction from the user; and
   calculating the switching waveform of the inverter based on the function formula,
   wherein an intermediate terminal is provided between an upper terminal and a lower terminal of an inverter arm, and
   wherein a power supply of a voltage function formula is provided between the upper terminal and the intermediate terminal or the intermediate terminal and the lower terminal;
   generating the switching waveform in the upper and lower terminals of the inverter arm;
   displaying a measured waveform and a fitting waveform thereof on a display screen; and
   controlling rotational speed and output torque of an electric motor based on the switching waveform.

2. The calculation method of the switching waveform of the inverter according to claim 1, further comprising:
   calculating a variation impact from peripheral circuits at time of switching; and
   performing voltage correction calculation to prevent the calculated switching waveform from changing due to the calculation of the variation impact.

3. A method for creating a circuit simulation model that calculates a switching waveform of an inverter, expresses a waveform obtained by measurement or simulation using a function formula, and calculates the switching waveform of the inverter, the method comprising:
   providing an upper arm and a lower arm of an inverter bridge as an integrated model;
   providing an upper terminal, a lower terminal and a gate terminal in both of the upper and lower arms;
   connecting one or more pairs of two intermediate terminals with at least one of the upper and lower arms; and
   outputting the circuit simulation model to a circuit simulator that implements the circuit simulation model; and
   controlling rotational speed and output torque of an electric motor based on the circuit simulation model.

4. A non-transitory computer-readable recording medium storing a program for creating a circuit simulation model that calculates a switching waveform of an inverter, expresses a waveform obtained by measurement or simulation using a function formula, and calculates the switching waveform of the inverter, which, when executed on a computer, causes the program to:
   provide an upper arm and a lower arm of an inverter bridge as an integrated model;
   provide an upper terminal, a lower terminal and a gate terminal in both of the upper and lower arms;
   connect one or more pairs of two intermediate terminals with at least one of the upper and lower arms; and
   output the circuit simulation model to a circuit simulator that implements the circuit simulation model; and
   control rotational speed and output torque of an electric motor based on the circuit simulation model.

* * * * *